United States Patent
Fujimoto (10) Patent No.: US 9,048,304 B2
(45) Date of Patent: Jun. 2, 2015

(54) SEMICONDUCTOR DEVICE AND METHOD OF MANUFACTURING SEMICONDUCTOR DEVICE

(71) Applicant: Kabushiki Kaisha Toshiba, Minato-ku, Tokyo (JP)

(72) Inventor: Hidetoshi Fujimoto, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 14/196,449

(22) Filed: Mar. 4, 2014

(65) Prior Publication Data
US 2015/0034904 A1     Feb. 5, 2015

(30) Foreign Application Priority Data
Aug. 5, 2013     (JP) .................................. 2013-162541

(51) Int. Cl.
| H01L 29/06 | (2006.01) |
| H01L 29/778 | (2006.01) |
| H01L 29/20 | (2006.01) |
| H01L 21/02 | (2006.01) |
| H01L 29/66 | (2006.01) |

(52) U.S. Cl.
CPC ........ H01L 29/7783 (2013.01); H01L 29/2003 (2013.01); H01L 21/02389 (2013.01); H01L 29/0688 (2013.01); H01L 29/66431 (2013.01)

(58) Field of Classification Search
CPC ............ H01L 29/2003; H01L 29/7786; H01L 29/7787; H01L 29/7788; H01L 29/872; H01L 29/435; H01L 29/49; H01L 29/0657; H01L 29/151

USPC .......................... 257/20–22, 76, 192; 438/172
See application file for complete search history.

(56) References Cited

U.S. PATENT DOCUMENTS

| 7,960,782 B2 | 6/2011 | Otake |
| 2009/0179258 A1 | 7/2009 | Otake |
| 2010/0210080 A1* | 8/2010 | Nomura et al. ................ 438/197 |
| 2011/0193096 A1* | 8/2011 | Imada ............................. 257/76 |

(Continued)

FOREIGN PATENT DOCUMENTS

| JP | 2008-227356 A | 9/2008 |
| JP | 2009-177110 A | 8/2009 |
| JP | 2011-035066 A | 2/2011 |
| JP | 2011-082397 A | 4/2011 |

(Continued)

OTHER PUBLICATIONS

Korean Office Action issued Jan. 23, 2015 in corresponding Korean Application No. 10-2013-0160951 with English Translation.

*Primary Examiner* — Brook Kebede
(74) *Attorney, Agent, or Firm* — White & Case LLP (57) ABSTRACT

In a semiconductor device, a first-layer includes a group-III nitride semiconductor of a first conduction type. A second-layer includes a group-III nitride semiconductor of a second conduction type on a first surface of the first layer. A third-layer includes an Al-containing group-III nitride semiconductor on a first region of a surface of the second layer. A gate electrode has one end above a surface of the third-layer and has the other end within the first-layer via the second-layer. The gate electrode is insulated from the first- to third-layers. A first electrode is connected to the third-layer. A second electrode is connected to a second region of the surface of the second-layer. A third electrode is provided above a second surface of the first layer. The second surface is opposite to the first surface of the first layer.

19 Claims, 9 Drawing Sheets

(56) References Cited

U.S. PATENT DOCUMENTS

| | | |
|---|---|---|
| 2012/0181548 A1 | 7/2012 | Okada et al. |
| 2012/0241751 A1 | 9/2012 | Yoshioka et al. |
| 2013/0105811 A1* | 5/2013 | Ando et al. ................. 257/76 |
| 2013/0248876 A1* | 9/2013 | Yaegashi et al. ........... 257/76 |
| 2013/0316507 A1 | 11/2013 | Saitoh et al. |

FOREIGN PATENT DOCUMENTS

| | | |
|---|---|---|
| JP | 2011-165777 A | 8/2011 |
| JP | 2012-156253 A | 8/2012 |
| JP | 2012-204351 A | 10/2012 |
| JP | 2013-125913 A | 6/2013 |
| KR | 10-2011-0074557 | 7/2012 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority from the prior Japanese Patent Application No. 2013-162541, filed on Aug. 5, 2013, the entire contents of which are incorporated herein by reference.

FIELD

The embodiments of the present invention relate to a semiconductor device and manufacturing method thereof.

BACKGROUND

Conventionally, a semiconductor power device is used in a power amplifier circuit, a power supply circuit, a motor drive circuit, or the like. Performances such as a high breakdown voltage, high-speed switching, and a low ON-resistance are required of the semiconductor power device. To meet these requirements, development of nitride semiconductor devices has been underway.

As the nitride semiconductor devices, gallium nitride (GaN)-based semiconductor devices using heterojunction of a HEMTs (High Electron Mobility Transistors) and HFETs (Heterojunction Field Effect Transistors) are proposed.

Conventionally, in order to form an n-GaN layer, n-impurity ions are implanted into a part of a p-GaN layer. However, in this case, the resistance of the n-GaN layer possibly rises because of the implantation of the n-impurity ions into a p-region. Furthermore, when the impurity concentration of the p-GaN layer is lowered so as to reduce the resistance of the n-GaN layer, the contact resistance between the p-GaN layer and an electrode located thereon is increased. For these reasons, it is difficult to realize the low ON-resistance of a vertical GaN-based semiconductor device.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor device according to the present embodiment includes a first-layer including a group-III nitride semiconductor of a first conduction type. A second-layer includes a group-III nitride semiconductor of a second conduction type on a first surface of the first layer. A third-layer includes an Al-containing group-III nitride semiconductor on a first region of a surface of the second layer. A gate electrode has one end above a surface of the third-layer and has the other end within the first-layer via the second-layer. The gate electrode is insulated from the first- to third-layers. A first electrode is connected to the third-layer. A second electrode is connected to a second region of the surface of the second-layer. A third electrode is provided above a second surface of the first layer. The second surface is opposite to the first surface of the first layer.

In the following embodiments, gallium nitride (GaN) is used as a group-III nitride semiconductor. Alternatively, aluminum nitride (AlN), indium nitride (InN) or a mixed crystal of AlN, InN and GaN can be used in place of the gallium nitride (GaN) as the group-III nitride semiconductor. The embodiments are explained below on an assumption that the group-III nitride semiconductor refers to the gallium nitride (GaN). Furthermore, in the embodiments, an AlGaN layer, for example, is used as an Al-containing group-III nitride semiconductor.

(First Embodiment)

Figure 1:
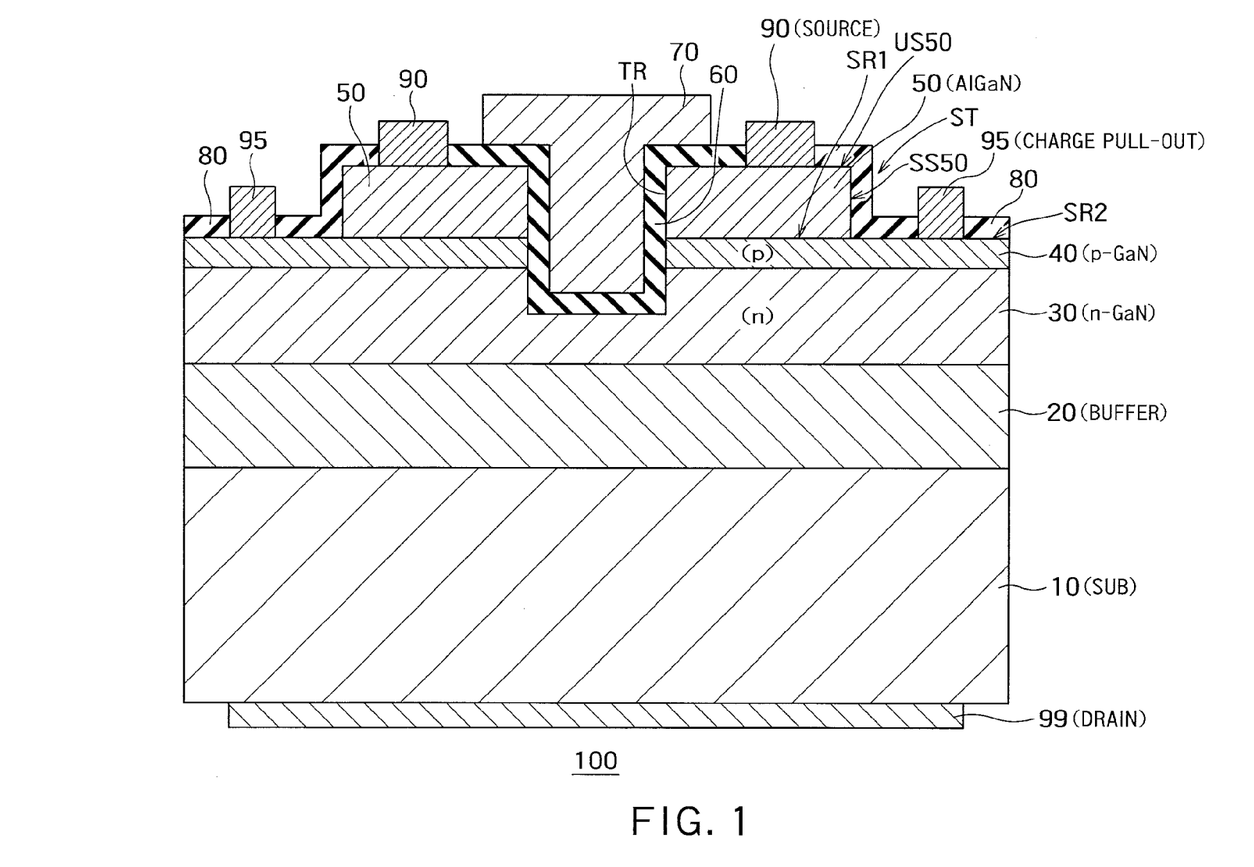
FIG. 1 is a cross-sectional view showing an example of a configuration of a vertical GaN semiconductor device 100 according to a first embodiment.

FIG. 1 is a cross-sectional view showing an example of a configuration of a vertical GaN semiconductor device 100 (hereinafter, also "semiconductor device 100") according to a first embodiment. The semiconductor device 100 includes a substrate 10, a buffer layer 20, an n-GaN layer 30, a p-GaN layer 40, an AlGaN layer 50, a gate dielectric film 60, a gate electrode 70, an interlayer dielectric film 80, source electrodes 90, charge pull-out electrodes 95, and a drain electrode 99.

For example, the substrate 10 is a silicon substrate, a GaN substrate, or an SiC substrate. Although a conduction type of the substrate 10 is not limited to a specific one, it is preferable that the conduction type is the same (an n-type, for example) as that of the n-GaN layer 30. The configuration of the semiconductor device 100 is described below while referring to an n-silicon substrate as the substrate 10 as an example.

The buffer layer 20 is provided on a surface (first surface) of the substrate 10. For example, the buffer layer 20 includes a superlattice structure in which the AlN and the GaN are alternately stacked or a compositionally-graded AlGaN layer for which an Al content of AlGaN gradually lowers from the surface of the substrate 10 toward the n-GaN layer 30. The buffer layer 20 interposing between the substrate 10 and a stacked structure that includes the n-GaN layer 30, the p-GaN layer 40, and the AlGaN layer 50 provided on the buffer layer 20 can suppress warping. Furthermore, the buffer layer 20 can improve a crystallinity of the stacked structure and reduce a longitudinal resistance thereof.

The n-GaN layer 30 serving as a first layer is provided on the buffer layer 20. That is, the buffer layer 20 is provided on a second surface of the n-GaN layer 30. The n-GaN layer 30 includes the GaN containing an n-impurity (silicon (Si) or germanium (Ge), for example). The p-GaN layer 40 serving as a second layer is formed on a first surface of the n-GaN layer 30. The first and the second surfaces of the n-GaN layer 30 are opposite to each other. The p-GaN layer 40 includes the GaN containing a p-impurity (magnesium (Mg), for example). The AlGaN layer 50 serving as a third layer is formed partially on first regions SR1 of a surface of the p-GaN layer 40. The AlGaN layer 50 includes the AlGaN into which no impurity is introduced. The n-GaN layer 30, the p-GaN layer 40, and the AlGaN layer 50 make the stacked structure of the GaN and the AlGaN (a GaN-AlGaN stacked structure). While the sum of a thickness of the GaN-AlGaN stacked structure and that of the buffer layer 20 depends on specifications, the sum is preferably equal to or larger than about 3 µm so that the semiconductor device 100 has a breakdown voltage of 600 V, for example.

By making a heterojunction structure between the AlGaN layer 50 and the p-GaN layer 40, two-dimensional electron gas (hereinafter, also "2DEG") is generated between the AlGaN layer 50 and the p-GaN layer 40. The 2DEG is useful for reducing an ON-resistance of the semiconductor device 100. A relation between the 2DEG and the ON-resistance is described later.

Trenches TR are provided to reach the n-GaN layer 30 from a surface US50 of the AlGaN layer 50 through the p-GaN layer 40. The gate dielectric film 60 is provided to cover the inner surfaces of the trenches TR and a part of the surface US50 of the AlGaN layer 50. The gate dielectric film 60 includes an insulating film such as a silicon oxide film. The gate electrode 70 is buried in the trenches TR via the gate dielectric film 60, respectively. The gate electrode 70 includes a metal stacked film made of, for example, Au/Ni or a conductive material such as doped polysilicon. The gate electrode 70 thereby functions as a trench gate electrode that reaches the n-GaN layer 30 from the surface US50 of the AlGaN layer 50 through the p-GaN layer 40. That is, one end of the gate electrode 70 is located above the surface US50 of the AlGaN layer 50 and the other end thereof is located within the n-GaN layer 30 via the p-GaN layer 40.

The interlayer dielectric film 80 is provided on the surface US50 and side surfaces SS50 of the AlGaN layer 50 and second regions SR2 of the surface of the p-GaN layer 40. The interlayer dielectric film 80 includes an insulating film such as a silicon oxide film. The interlayer dielectric film 80 can include either the same material as or a different material from that of the gate dielectric film 60.

Each of the source electrodes 90 serving as a first electrode is provided on the surface US50 of the AlGaN layer 50 and connected to the AlGaN layer 50 by ohmic junction. The material of the source electrodes 90 suffices to be a material that can be connected to the AlGaN layer 50 by the ohmic junction and the source electrodes 90 include a metal material such as Ti/Al. The AlGaN layer 50 is formed to have quite a small thickness, for example, a thickness of about 30 nm so that the source electrodes 90 can be connected to the AlGaN layer 50 by the ohmic junction. An Al content of the AlGaN layer 50 is about 20%, for example. The charge pull-out electrodes 95 are provided on the second regions SR2 of the surface of the p-GaN layer 40 and connected to the p-GaN layer 40 by the ohmic junction. The second regions SR2 are surface regions other than the first regions SR1 of the surface of the p-GaN layer 40.

The material of the charge pull-out electrodes 95 each serving as a second electrode suffices to be a material that can be connected to the p-GaN layer 40 by the ohmic junction, and the charge pull-out electrodes 95 include a metal stacked film made of Au/Ni, for example. When the charge pull-out electrodes 95 include the metal stacked film made of Au/Ni, then an Ni layer as a lower layer is brought into contact with the p-GaN layer 40 and an Au layer is provided on the Ni layer. The charge pull-out electrodes 95 can be thereby connected to the p-GaN layer 40 by the ohmic junction and provided as low-resistance electrodes.

The drain electrode 99 serving as a third electrode is provided on a back surface (second surface) of the substrate 10. The drain electrode 99 includes a metal material made of TiAl similarly to the source electrodes 90, for example.

The semiconductor device 100 is a vertical FET and channels are provided in the p-GaN layer 40 near the gate dielectric film 60. Therefore, the channels are provided in boundary portions between the gate dielectric film 60 and the p-GaN layer 40 by controlling a voltage of the gate electrode 70. A current from the drain electrode 99 passes through the channels in the p-GaN layer 40 via the substrate 10, the buffer layer 20, and the n-GaN layer 30, further passes through the AlGaN layer 50, and flows into the source electrodes 90.

When the p-GaN layer 40 is set into a floating state, then holes are accumulated in the p-GaN layer 40 and avalanche breakdown possibly occurs to the semiconductor device 100. To suppress the avalanche breakdown, it is necessary to provide the charge pull-out electrodes 95. The charge pull-out electrodes 95 are fixed to a predetermined voltage (a ground voltage, for example) and function to pull out the holes accumulated in the p-GaN layer 40.

Steps ST are explained here. The AlGaN layer 50 according to the first embodiment is provided on the first regions SR1 of the surface of the p-GaN layer 40 and not on the second regions SR2. That is, the AlGaN layer 50 is provided partially on the surface of the p-GaN layer 40 and does not cover the entire surface of the p-GaN layer 40. Therefore, the steps ST formed by the AlGaN layer 50 and the p-GaN layer 40 are located between the first regions SR1 and the second regions SR2, respectively. Each of the steps ST has a lower stage constituted by one second region SR2 of the surface of the p-GaN layer 40 and an upper stage constituted by the surface US50 of the AlGaN layer 50. The side surface SS50 of the AlGaN layer 50 is located between the lower and upper stages of the step ST. Therefore, the steps ST are formed by the second regions SR2 of the surface of the p-GaN layer 40, the side surfaces SS50 of the AlGaN layer 50, and the surface US50 of the AlGaN layer 50.

The presence of the steps ST enables the source electrodes 90 to be formed on the surface US50 of the AlGaN layer 50 (the upper stages of the steps ST) and enables the charge pull-out electrodes 95 to be formed on the second regions SR2 of the surface of the p-GaN layer 40 (the lower stages of the steps ST). That is, the presence of the steps ST can secure formation regions for the source electrodes 90 and the charge pull-out electrodes 95 and facilitate forming the source electrodes 90 and the charge pull-out electrodes 95. It is thereby possible to suppress the avalanche breakdown and maintain a high breakdown voltage.

For example, it is also considered to form an n-GaN layer in place of the AlGaN layer 50 by implanting n-impurity (Si or Ge, for example) ions into the p-GaN layer 40. However, in this case, a resistance of the n-GaN layer possibly rises in an ion-implanted region because of the implantation of the n-impurity ions into a p-region (the p-GaN layer 40).

On the other hand, according to the first embodiment, the AlGaN layer 50 is selectively and epitaxially grown on the p-GaN layer 40. It is thereby possible to secure the formation regions for the charge pull-out electrodes 95 on the surface of the p-GaN layer 40 and to epitaxially grow the AlGaN layer 50. At the time of the epitaxial growth, no impurity is introduced into the AlGaN layer 50. That is, the AlGaN layer 50 is epitaxially grown in an intrinsic state. However, by providing the AlGaN layer 50 to have quite a small thickness (equal to or smaller than 30 nm, for example), the AlGaN layer 50 can be connected to the source electrodes 90 by the ohmic junction. That is, according to the first embodiment, it is possible to reduce a resistance of the AlGaN layer 50 and secure the formation regions for the charge pull-out electrodes 95 for suppressing the avalanche breakdown. As a result, the semiconductor device 100 according to the first embodiment can suppress a reduction in the breakdown voltage.

Furthermore, as described above, the 2DEG is generated between the AlGaN layer 50 and the p-GaN layer 40. The 2DEG shows a high electron mobility and a high carrier concentration. That is, an interface between the AlGaN layer 50 and the p-GaN layer 40 has quite a low resistance and many electrons are generated on the interface. Therefore, when the semiconductor device 100 is turned on, the 2DEG is supplied to the channels formed in the p-GaN layer 40 near the gate dielectric film 60. The 2DEG can thereby reduce the ON-resistance of the semiconductor device 100. Furthermore, the 2DEG is generated on the interface between the AlGaN layer 50 and the p-GaN layer 40 near channel formation regions. Therefore, when the semiconductor device 100 is switched, the 2DEG promptly supplies electrons to the channels without waiting for electrons from the source electrode 90. Therefore, the semiconductor device 100 according to the first embodiment has a high switching speed. As a result, the semiconductor device 100 according to the first embodiment can realize both the low ON-resistance and the high breakdown voltage and also realize an accelerated switching operation.

FIGS. 2 to 5 are cross-sectional views showing an example of a manufacturing method of the semiconductor device 100 according to the first embodiment. The manufacturing method of the semiconductor device 100 is explained with reference to FIGS. 2 to 5.

Figure 2:
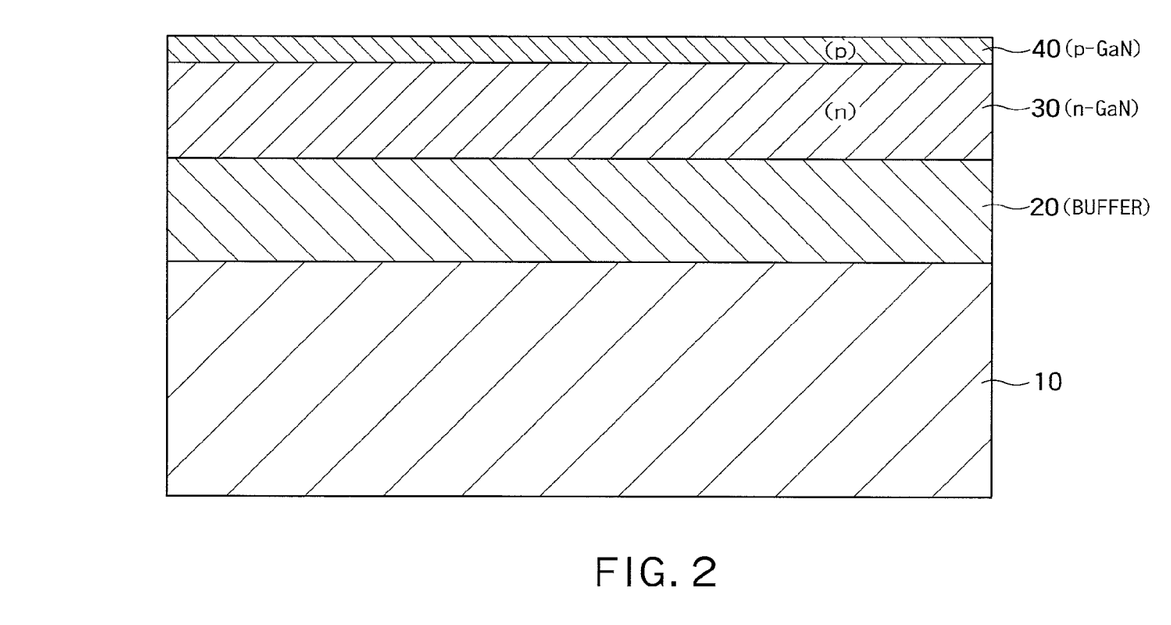
FIGS. 2 to 5 are cross-sectional views showing an example of a manufacturing method of the semiconductor device 100 according to the first embodiment.

First, the buffer layer 20 is formed on the substrate 10 using an MOCVD (Metal-Organic Chemical Vapor Deposition) method. The buffer layer 20 has either the superlattice structure of the AlN and the GaN ("AlN-GaN superlattice structure") or the compositionally-graded AlGaN layer as described above. For example, in a case of forming the AlN-GaN superlattice structure on the substrate 10, AlN layers and GaN layers are alternately stacked on the substrate 10 in an order of the AlN layer, the GaN layer, the AlN layer, the GaN layer, the AlN layer, the GaN layer, and so on. The buffer layer 20 can thereby absorb warping generated by differences in lattice constants and thermal expansion coefficients between the substrate 10 and the n-GaN layer 30. It is assumed that the uppermost layer of the buffer layer 20 is the GaN layer. This can facilitate forming the n-GaN layer 30 on the buffer layer 20.

Alternatively, in a case of forming the compositionally-graded AlGaN layer on the substrate 10, the AlGaN is grown by setting the initial Al content of the AlGaN to 100% and gradually reducing the Al content. The Al content is set to 0% on the uppermost portion of the buffer layer 20. That is, the AlN is grown on the substrate 10 at the beginning of the deposition of the buffer layer 20, the AlGaN is then grown while reducing the Al content, and the GaN is finally grown. With this configuration, the Al layer in the compositionally-graded AlGaN layer contacts the surface of the substrate 10, and the GaN layer in the compositionally-graded AlGaN layer contacts a bottom of the n-GaN layer 30. The buffer layer 20 can thereby absorb the warping generated by the differences in the lattice constants and the thermal expansion coefficients between the substrate 10 and the n-GaN layer 30. It is also possible to facilitate forming the n-GaN layer 30 on the buffer layer 20.

Next, the n-GaN layer 30 is grown on the buffer layer 20 using the MOCVD method. At this time, the GaN is grown while adding the n-impurity (Si or Ge, for example) to the GaN.

The p-GaN layer 40 is then grown on the n-GaN layer 30 using the MOCVD method. At this time, the GaN is grown while adding the p-impurity (Mg, for example) to the GaN. A structure shown in FIG. 2 is thereby obtained.

Figure 3:
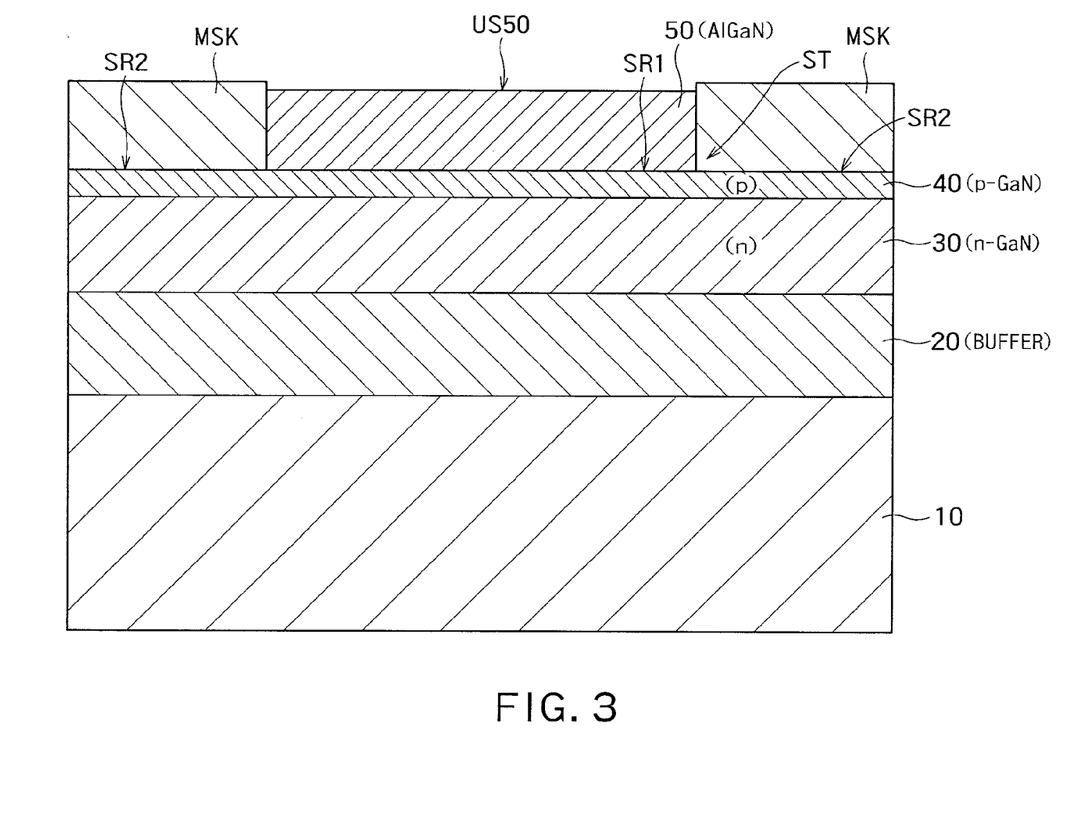

Next, as shown in FIG. 3, a mask layer MSK is formed on the second regions SR2 of the surface of the p-GaN layer 40 using a lithographic technique and an etching technique. The mask layer MSK is, for example, an insulating film such as a silicon oxide film. By covering the second regions SR2 with the mask layer MSK, the AlGaN layer 50 is not epitaxially grown on the second regions SR2. On the other hand, the AlGaN layer 50 can be epitaxially grown on the first regions SR1 on which the mask layer MSK is not formed.

Next, using the mask layer MSK as a mask, the AlGaN is epitaxially grown. The AlGaN layer 50 is thereby selectively and epitaxially grown on the first regions SR1 of the surface of the p-GaN layer 40. At this time, no impurity is introduced into the AlGaN layer 50. By selectively and epitaxially growing the AlGaN layer 50, the steps ST are formed as shown in FIG. 3. As for the steps ST, the second regions SR2 of the surface of the p-GaN layer 40 constitute the lower stages and the surface US50 of the AlGaN layer 50 constitutes the upper stages.

Figure 4:
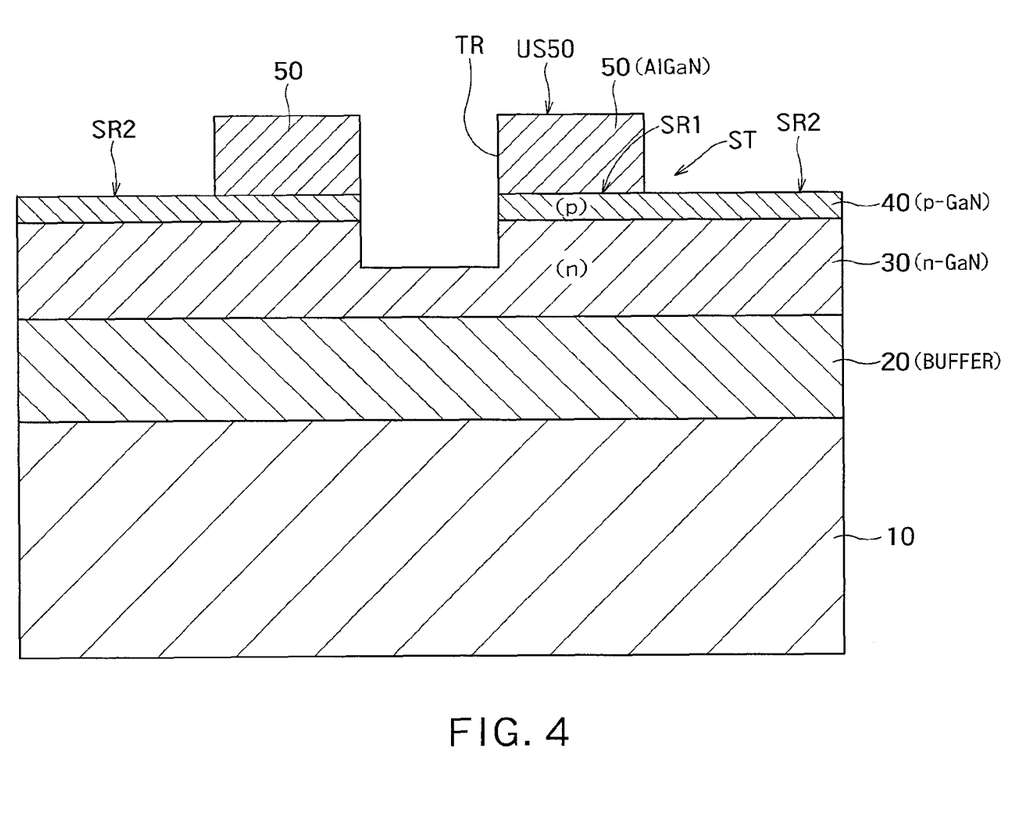

After removing the mask layer MSK, the trenches TR reaching the n-GaN layer 30 from the surface US50 of the AlGaN layer 50 through the p-GaN layer 40 are formed using the lithographic technique and the etching technique. A structure shown in FIG. 4 is thereby obtained.

Next, the gate dielectric film 60 is deposited on the inner surfaces of the trenches TR, the surface US50 and the side surfaces SS50 of the AlGaN layer 50, and the second regions SR2 of the surface of the p-GaN layer 40.

Figure 5:
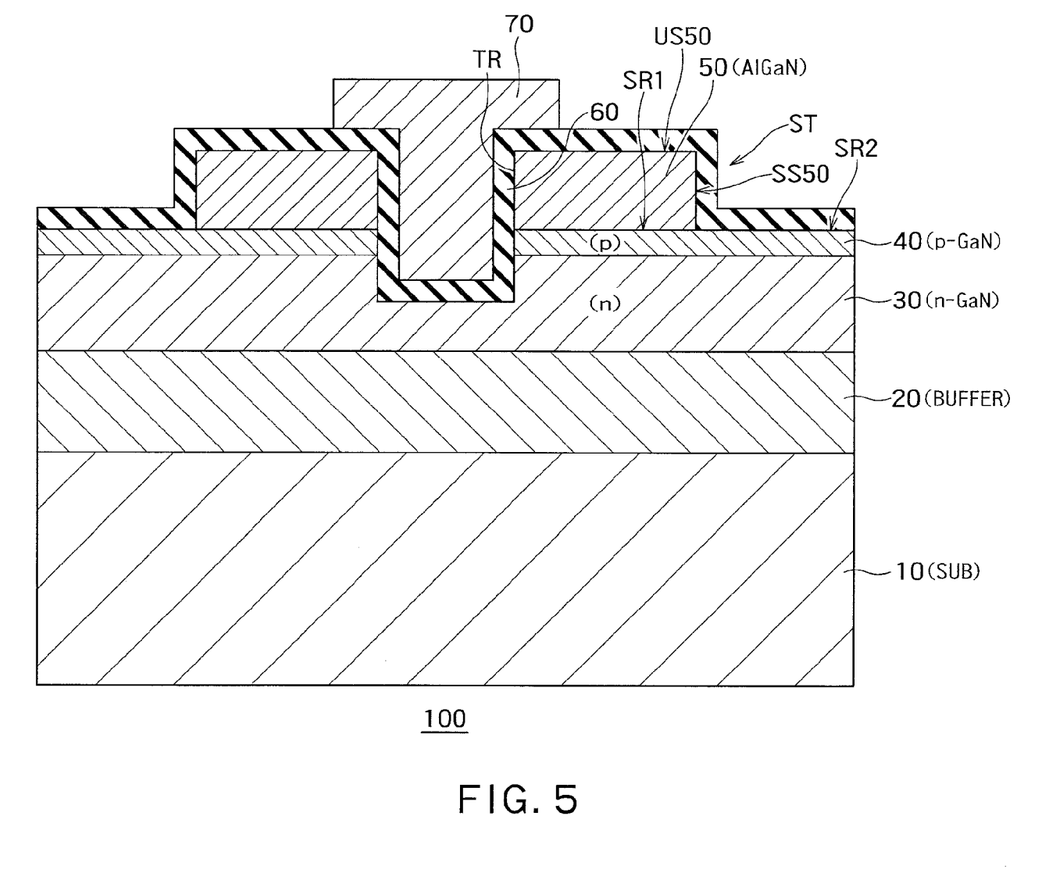

The material of the gate electrode 70 is then buried in the trenches TR. The material of the gate electrode 70 is processed using the lithographic technique and the etching technique. The gate electrode 70 is thereby formed as shown in FIG. 5. The gate electrode 70 is formed to reach the n-GaN layer 30 from the surface US50 of the AlGaN layer 50 through the p-GaN layer 40. That is, the gate electrode 70 is formed so that one end is above the surface US50 of the AlGaN layer 50 and that the other end is within the n-GaN layer 30 via the p-GaN layer 40. The gate electrode 70 is insulated from the AlGaN layer 50, the p-GaN layer 40, and the n-GaN layer 30 by the gate dielectric film 60.

Next, after depositing the interlayer dielectric film 80 as needed, contact holes are formed on the surface US50 of the AlGaN layer 50 using the lithographic technique and the etching technique. Next, after depositing the material of the source electrodes 90, the material of the source electrodes 90 is processed using the lithographic technique and the etching technique. The source electrodes 90 are thereby formed on the surface US50 of the AlGaN layer 50 as shown in FIG. 1.

Next, after depositing again the interlayer dielectric film 80 as needed, contact holes are formed on the second regions SR2 of the surface of the p-GaN layer 40 using the lithographic technique and the etching technique. Next, after depositing the material of the charge pull-out electrodes 95, the material of the charge pull-out electrodes 95 is processed using the lithographic technique and the etching technique. The charge pull-out electrodes 95 are thereby formed on the second regions SR2 of the p-GaN layer 40 as shown in FIG. 1.

In this way, the source electrodes 90 are formed on the surface US50 of the AlGaN layer 50 (the upper stages of the steps ST), and the charge pull-out electrodes 95 are formed on the second regions SR2 of the p-GaN layer 40 (the lower stages of the steps ST).

Next, the drain electrode 99 is formed on the back surface of the substrate 10. The semiconductor device 100 shown in FIG. 1 is thereby completed.

According to the first embodiment, the AlGaN layer 50 is selectively and epitaxially grown on the first regions SR of the surface of the p-GaN layer 40. The steps ST each having the lower stage constituted by the second region SR2 of the surface of the p-GaN layer 40 and the upper stage constituted by the surface US50 of the AlGaN layer 50 are thereby formed. The presence of the steps ST enables the source electrodes 90 to be formed on the surface US50 of the AlGaN layer 50 (the upper stages of the steps ST) and enables the charge pull-out electrodes 95 to be formed on the second regions SR2 of the surface of the p-GaN layer 40 (the lower stages of the steps ST). That is, the formation regions for the source electrodes 90 and the charge pull-out electrodes 95 can be secured. And, forming the source electrodes 90 and the charge pull-out electrodes 95 can be facilitated. It is thereby possible to suppress the avalanche breakdown and maintain the high breakdown voltage.

Furthermore, the AlGaN layer 50 is selectively and epitaxially grown on the p-GaN layer 40. This can secure the formation regions for the charge pull-out electrodes 95. In addition, by forming the AlGaN layer 50 to be thin, the resistance of the AlGaN layer 50 can be reduced and the source electrodes 90 can be connected to the AlGaN layer 50 by the ohmic junction. As a result, the semiconductor device 100 according to the first embodiment can realize both the high breakdown voltage and the low ON-resistance.

(First Modification)

In the first embodiment, the buffer layer 20 includes either the superlattice structure in which the AlN and the GaN are alternately stacked or the compositionally-graded AlGaN layer for which the Al content is gradually changed. According to a first modification, Si or Ge is introduced into the buffer layer 20.

When the substrate 10 is the silicon substrate, silicon is possibly diffused in a bottom portion of the buffer layer 20. Furthermore, the n-GaN layer 30 located on the buffer layer 20 contains Si or Ge. Therefore, silicon is possibly diffused in an upper portion of the buffer layer 20 as well. That is, it is considered that the bottom and upper portions of the buffer layer 20 are n-layers, respectively.

In this modification, Si or Ge is further introduced into an intermediate portion (an intermediate layer) of the buffer layer 20. With this configuration, the intermediate portion of the buffer layer 20 also includes either the n-type superlattice structure or the compositionally-graded n-AlGaN layer. By making the entire buffer layer 20 as the n-layers, the resistance of the buffer layer 20 lowers. By reducing the resistance of the buffer layer 20, it is possible to further reduce the ON-resistance of the semiconductor device 100 because the semiconductor device 100 is the vertical FET. It suffices to introduce the n-impurity at the time of forming the buffer layer 20.

(Second Modification)

The source electrodes 90 and the charge pull-out electrodes 95 can include the same material as long as the source electrodes 90 and the charge pull-out electrodes 95 can be connected to the AlGaN layer 50 and the p-GaN layer 40 by the ohmic junction, respectively. In this case, it is unnecessary to individually form the contact holes for the source electrodes 90 and the charge pull-out electrodes 95 but it suffices to form common contact holes. Furthermore, it is possible to commonly deposit and process an electrode material. This can reduce the number of lithographic processes and etching processes, thereby making it possible to reduce manufacturing processes.

Generally, the source electrodes 90 and the charge pull-out electrodes 95 are often set to have the same voltage. Therefore, no problems occur even if the source electrodes 90 and the charge pull-out electrodes 95 are common electrodes. The second modification can be combined with the first modification.

(Second Embodiment)

Figure 6:
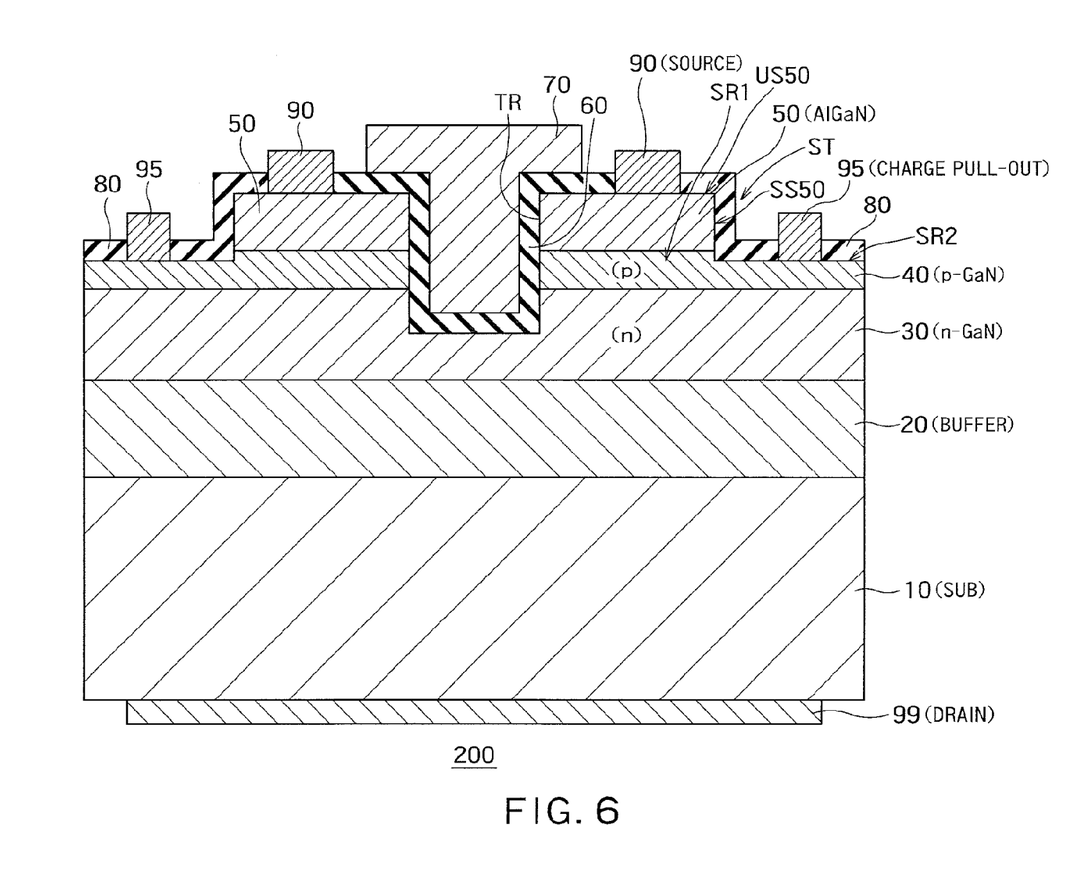
FIG. 6 is a cross-sectional view showing an example of a configuration of a vertical GaN semiconductor device 200 according to a second embodiment.

FIG. 6 is a cross-sectional view showing an example of a configuration of a vertical GaN semiconductor device 200 (hereinafter, also "semiconductor device 200") according to a second embodiment. In the semiconductor device 200 according to the second embodiment, lower portions of the side surfaces SS of the steps ST are constituted by the p-GaN layer 40 and upper portions of the side surfaces SS thereof are constituted by the AlGaN layer 50. That is, an upper portion of the p-GaN layer 40 is removed. Other configurations of the second embodiment can be identical to corresponding ones of the first embodiment.

In the semiconductor device 200 according to the second embodiment, similarly to the first embodiment, the presence of the steps ST enables the source electrodes 90 to be provided on the surface US50 of the AlGaN layer 50 (the upper stages of the steps ST) and enables the charge pull-out electrodes 95 to be provided on the second regions SR2 of the surface of the p-GaN layer 40 (the lower stages of the steps ST). In the second embodiment, the AlGaN layer 50 is epitaxially grown on the p-GaN layer 40. Therefore, the second embodiment can achieve effects identical to those of the first embodiment.

Figure 7:
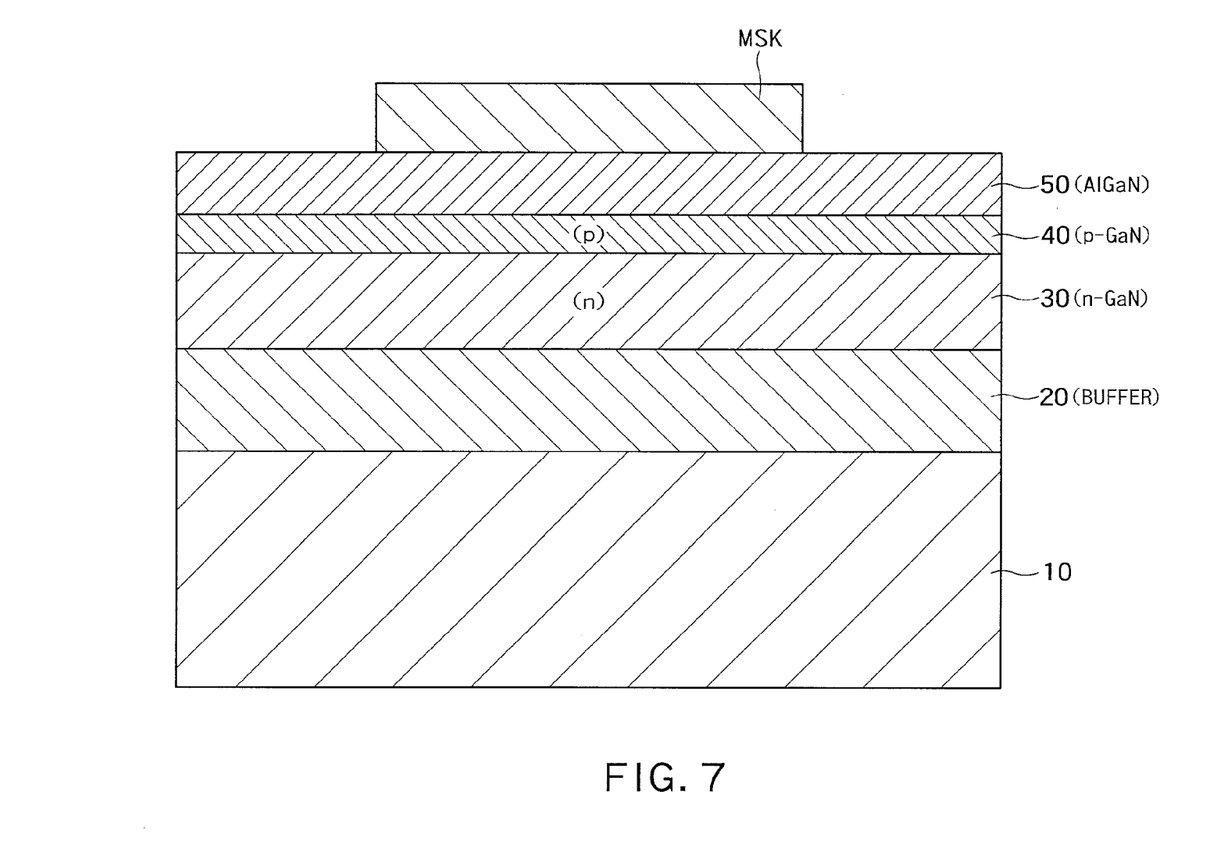
FIGS. 7 and 8 are cross-sectional views showing an example of a manufacturing method of the semiconductor device 200 according to the second embodiment.
Figure 8:
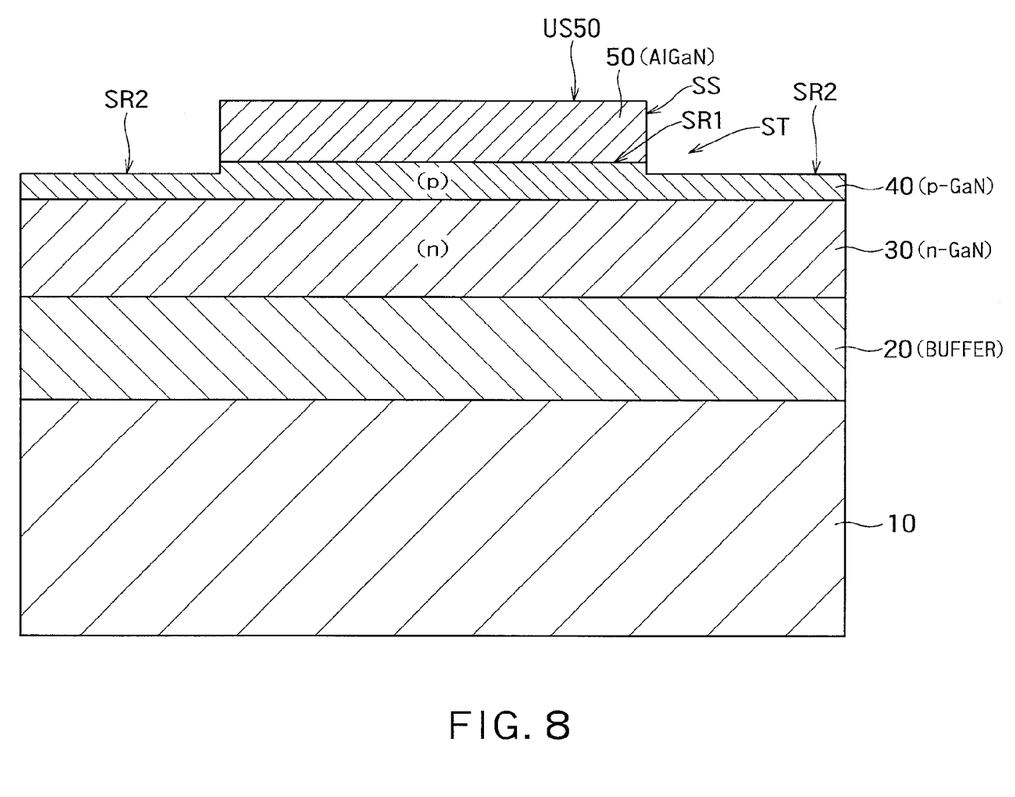

FIGS. 7 and 8 are cross-sectional views showing an example of a manufacturing method of the semiconductor device 200 according to the second embodiment.

First, similarly to the first embodiment, the structure shown in FIG. 2 is obtained. Next, the AlGaN is epitaxially grown on the p-GaN layer 40. The Al content of the AlGaN layer 50 is, for example, about 20%. The thickness of the AlGaN layer 50 is, for example, about 30 nm. At this time, no impurity is introduced into the AlGaN layer 50.

The mask layer MSK is then formed on the AlGaN layer 50 using the lithographic technique and the etching technique. The mask layer MSK is left on formation regions for the AlGaN layer 50 and removed on the other regions (the second regions SR2). A structure shown in FIG. 7 is thereby obtained.

Next, using the mask layer MSK as a mask, the AlGaN layer 50 is etched. A material layer of the AlGaN layer 50 located on the second regions SR2 of the surface of the p-GaN layer 40 is thereby selectively removed. As a result, the steps ST having the lower stages constituted by the second regions SR2 of the surface of the p-GaN layer 40 and the upper stages constituted by the surface US50 of the AlGaN layer 50 are formed. In this etching process, not only the AlGaN layer 50 but also the upper portion of the p-GaN layer 40 is overetched. Therefore, as shown in FIG. 8, the upper portions of the side surfaces SS of the steps ST are constituted by the AlGaN layer 50 and the lower portions thereof are constituted by the p-GaN layer 40.

Thereafter, similarly to the first embodiment, the trenches TR, the gate dielectric film 60, the gate electrode 70, the source electrodes 90, the charge pull-out electrodes 95, and the drain electrode 99 are formed. The semiconductor device 200 shown in FIG. 6 is thereby completed.

According to the second embodiment, after the AlGaN layer 50 is epitaxially grown on the entire surface of the p-GaN layer 40, the AlGaN layer 50 is selectively etched using the mask layer MSK. The steps ST are thereby formed similarly to the first embodiment. Because the AlGaN layer 50 is selectively etched, the upper portion of the p-GaN layer 40 is over-etched. Therefore, the AlGaN layer 50 appears in the upper portions of the side surfaces SS of the steps ST and the p-GaN layer 40 appears in the lower portions thereof.

In this way, the steps ST can be formed even if the epitaxially-grown AlGaN layer 50 is selectively etched. Accordingly, the second embodiment can achieve effects identical to those of the first embodiment.

Furthermore, according to the second embodiment, after forming the p-GaN layer 40, the AlGaN layer 50 can be continuously formed. Therefore, it is possible to suppress particles or the like from entering between the p-GaN layer 40 and the AlGaN layer 50.

Further, the first and second modifications can be combined with the second embodiment.

(Third Embodiment)

Figure 9:
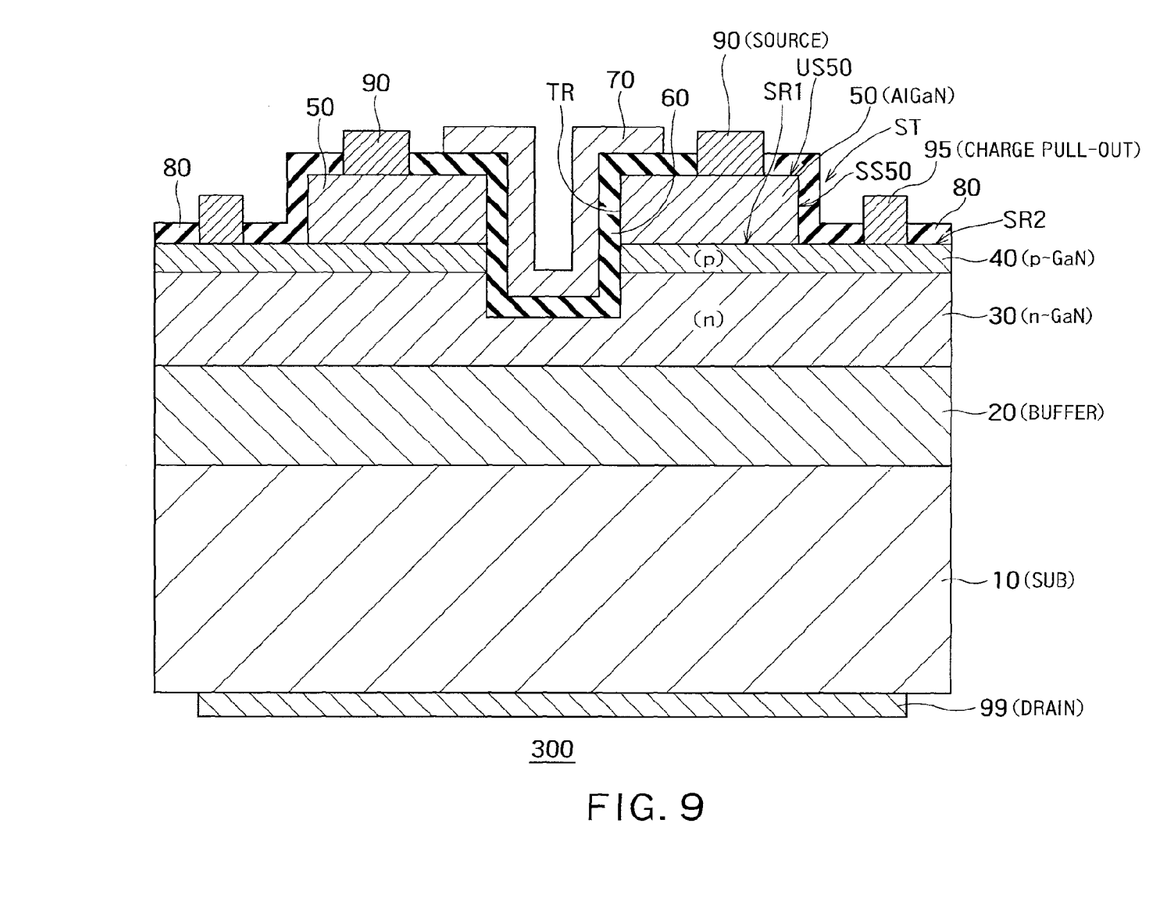
FIG. 9 is a cross-sectional view showing an example of a configuration of a vertical GaN semiconductor device 300 according to a third embodiment.

FIG. 9 is a cross-sectional view showing an example of a configuration of a vertical GaN semiconductor device 300 (hereinafter, also "semiconductor device 300") according to a third embodiment. In the semiconductor device 300 according to the third embodiment, the gate electrode 70 is not completely buried in the trenches TR. However, the gate electrode 70 covers the inner surfaces of the trenches TR via the gate dielectric film 60. Other configurations of the third embodiment can be identical to corresponding ones of the first embodiment. Therefore, the third embodiment can achieve effect identical to those of the first embodiment. Furthermore, the third embodiment can be combined with at least one of the first and second modifications and the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first layer including a group-III nitride semiconductor of a first conduction type;
a second layer including a group-III nitride semiconductor of a second conduction type on a first surface of the first layer;
a third layer including an Al-containing group-III nitride semiconductor on a first region of a surface of the second layer;
a gate electrode having one end above a surface of the third layer and the other end within the first layer via the second layer, the gate electrode being insulated from the first layer, the second layer and the third layer;
a first electrode connected to the third layer;
a second electrode connected to a second region of the surface of the second layer; and
a third electrode provided above a second surface of the first layer, the second surface being opposite to the first surface of the first layer.

2. The device of claim 1, further comprising a step having the second region of the surface of the second layer as a lower stage and the surface of the third layer as an upper stage, wherein
the first electrode is provided on the upper stage of the step, and
the second electrode is provided on the lower stage of the step.

3. The device of claim 2, wherein
a lower portion of a side surface of the step includes the second layer, and
an upper portion of the side surface of the step includes the third layer.

4. The device of claim 1, wherein the first electrode and the second electrode include a same material.

5. The device of claim 2, wherein the first electrode and the second electrode include a same material.

6. The device of claim 3, wherein the first electrode and the second electrode include a same material.

7. The device of claim 1, further comprising a buffer layer provided on the second surface of the first layer, wherein
the buffer layer includes either a superlattice structure in which AlN and GaN are alternately stacked or a compositionally-graded AlGaN layer in which an Al content of AlGaN is gradually changed, and
Si or Ge is contained in an intermediate portion of the buffer layer.

8. The device of claim 2, further comprising a buffer layer provided on the second surface of the first layer, wherein
the buffer layer includes either a superlattice structure in which AlN and GaN are alternately stacked or a compositionally-graded AlGaN layer in which an Al content of AlGaN is gradually changed, and
Si or Ge is contained in an intermediate portion of the buffer layer.

9. The device of claim 3, further comprising a buffer layer provided on the second surface of the first layer, wherein
the buffer layer includes either a superlattice structure in which AlN and GaN are alternately stacked or a compositionally-graded AlGaN layer in which an Al content of AlGaN is gradually changed, and
Si or Ge is contained in an intermediate portion of the buffer layer.

10. The device of claim 1, wherein the third layer is a layer including the Al-containing group-III nitride semiconductor which is epitaxially grown.

11. A method of manufacturing a semiconductor device comprising:
forming a second layer including a group-III nitride semiconductor of a second conduction type on a first surface of a first layer including a group-III nitride semiconductor of a first conduction type;
forming a third layer including an Al-containing group-III nitride semiconductor on a first region of a surface of the second layer;
forming a gate electrode reaching the first layer from a surface of the third layer through the second layer, the gate electrode being insulated from the first layer, the second layer, and the third layer;
forming a first electrode on the third layer;
forming a second electrode on a second region of the surface of the second layer; and
forming a third electrode above a second surface of the first layer, the second surface being opposite to the first surface of the first layer.

12. The method of claim 11, wherein
the formation of the third layer comprises:
forming a material layer of the third layer on the surface of the second layer by epitaxially growing the Al-containing group-III nitride semiconductor; and
selectively removing the material layer of the third layer on the second region of the surface of the second layer.

13. The method of claim 11, wherein
the formation of the third layer comprises:
forming an insulating film on the second region of the surface of the second layer; and
selectively and epitaxially growing the Al-containing group-III nitride semiconductor on the first region of the surface of the second layer using the insulating film as a mask.

14. The method of claim 11, wherein
a step including the second region of the surface of the second layer as a lower stage and including the surface of the third layer as an upper stage is formed by the formation of the third layer,
the first electrode is formed on the upper stage of the step, and
the second electrode is formed on the lower stage of the step.

15. The method of claim 12, wherein
a step including the second region of the surface of the second layer as a lower stage and including the surface of the third layer as an upper stage is formed by the formation of the third layer,
the first electrode is formed on the upper stage of the step, and
the second electrode is formed on the lower stage of the step.

16. The method of claim 13, wherein
a step including the second region of the surface of the second layer as a lower stage and including the surface of the third layer as an upper stage is formed by the formation of the third layer,
the first electrode is formed on the upper stage of the step, and
the second electrode is formed on the lower stage of the step.

17. The method of claim 11, further comprising:
forming a buffer layer on the second surface of the first layer, wherein
the formation of the buffer layer comprises:
forming a superlattice structure in which AlN and GaN are alternately stacked or forming a compositionally-graded AlGaN layer in which an Al content of AlGaN is gradually changed; and
introducing Si or Ge into an intermediate portion of the buffer layer.

18. The method of claim 12, further comprising:
forming a buffer layer on the second surface of the first layer, wherein
the formation of the buffer layer comprises:
forming a superlattice structure in which AlN and GaN are alternately stacked or forming a compositionally-graded AlGaN layer in which an Al content of AlGaN is gradually changed; and
introducing Si or Ge into an intermediate portion of the buffer layer.

19. The method of claim 13, further comprising:
forming a buffer layer on the second surface of the first layer, wherein
the formation of the buffer layer comprises:
forming a superlattice structure in which AlN and GaN are alternately stacked or forming a compositionally-graded AlGaN layer in which an Al content of AlGaN is gradually changed; and
introducing Si or Ge into an intermediate portion of the buffer layer.

* * * * *